(12) United States Patent
Ramalingam

(10) Patent No.: US 10,008,250 B2
(45) Date of Patent: Jun. 26, 2018

(54) SINGLE LEVEL CELL WRITE BUFFERING FOR MULTIPLE LEVEL CELL NON-VOLATILE MEMORY

(71) Applicant: Intel Corporation, Santa Clara, CA (US)

(72) Inventor: Anand S. Ramalingam, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/671,493

(22) Filed: Mar. 27, 2015

(65) Prior Publication Data

US 2016/0284393 A1    Sep. 29, 2016

(51) Int. Cl.
| | |
|---|---|
| G11C 11/56 | (2006.01) |
| G11C 7/00 | (2006.01) |
| G11C 11/16 | (2006.01) |
| G11C 16/34 | (2006.01) |
| G06F 12/02 | (2006.01) |
| G11C 13/00 | (2006.01) |
| G11C 16/04 | (2006.01) |

(52) U.S. Cl.
CPC ...... *G11C 11/1675* (2013.01); *G06F 12/0238* (2013.01); *G11C 11/5628* (2013.01); *G11C 13/0035* (2013.01); *G11C 13/0069* (2013.01); *G11C 16/3495* (2013.01); *G06F 2212/7205* (2013.01); *G06F 2212/7208* (2013.01); *G11C 13/0004* (2013.01); *G11C 16/0483* (2013.01); *G11C 2211/5641* (2013.01); *G11C 2213/71* (2013.01)

(58) Field of Classification Search
CPC .................................................. G11C 11/1675

USPC ..................................................... 365/185.03
See application file for complete search history.

(56) References Cited

U.S. PATENT DOCUMENTS

| | | | | |
|---|---|---|---|---|
| 5,930,167 | A * | 7/1999 | Lee ...................... | G06F 12/0246 365/185.03 |
| 8,261,158 | B2 * | 9/2012 | Thatcher ................ | G11C 16/10 714/763 |
| 8,407,400 | B2 * | 3/2013 | Marotta ................. | G11C 16/16 711/103 |

(Continued)

FOREIGN PATENT DOCUMENTS

CN    107466418 A    12/2017

OTHER PUBLICATIONS

"Intel Solid-Sate Drives in Server Storage Applications", White Paper, Feb. 2014, 24 pages, Intel Corporation, Santa Clara, CA.

(Continued)

*Primary Examiner* — Anthan Tran
*Assistant Examiner* — Mushfique Siddique
(74) *Attorney, Agent, or Firm* — Spectrum IP Law Group LLC

(57) ABSTRACT

Methods and apparatus related to cost optimized Single Level Cell (SLC) write buffering for Three Level Cell (TLC) Solid State Drives (SSDs) are described. In one embodiment, non-volatile memory includes a first region in a Single Level Cell (SLC) mode and a second region in a multiple level cell mode. A portion of the second region is moved from the multiple level cell mode to the SLC mode, without adding any new capacity to the non-volatile memory and without reducing any existing capacity from the non-volatile memory.

25 Claims, 7 Drawing Sheets

(56) References Cited

U.S. PATENT DOCUMENTS

| | | | |
|---|---|---|---|
| 8,760,957 B2* | 6/2014 | Lee | G11C 7/18 365/189.08 |
| 9,099,185 B2* | 8/2015 | Kim | G11C 13/004 |
| 9,182,928 B2* | 11/2015 | Gorobets | G06F 3/061 |
| 9,870,169 B2* | 1/2018 | Ramalingam | G06F 3/0647 |
| 2008/0043527 A1* | 2/2008 | Aritome | G11C 5/04 365/185.03 |
| 2008/0172520 A1* | 7/2008 | Lee | G11C 11/5628 711/103 |
| 2008/0215800 A1 | 9/2008 | Lee et al. | |
| 2009/0310408 A1* | 12/2009 | Lee | G11C 11/5628 365/185.03 |
| 2010/0122016 A1* | 5/2010 | Marotta | G06F 12/0246 711/103 |
| 2010/0205352 A1* | 8/2010 | Chu | G06F 12/0246 711/103 |
| 2011/0013451 A1* | 1/2011 | Han | G11C 11/5628 365/185.03 |
| 2011/0252187 A1* | 10/2011 | Segal | G06F 12/0246 711/103 |
| 2012/0017138 A1* | 1/2012 | Erez | G06F 11/1004 714/773 |
| 2012/0155167 A1* | 6/2012 | Uehara | G11C 11/5628 365/185.03 |
| 2012/0246391 A1 | 9/2012 | Meir et al. | |
| 2012/0254574 A1* | 10/2012 | Sinclair | G11C 11/5628 711/165 |
| 2013/0007344 A1 | 1/2013 | Belgal et al. | |
| 2013/0124787 A1* | 5/2013 | Schuette | G06F 12/0246 711/103 |
| 2013/0138870 A1* | 5/2013 | Yoon | G11C 11/5621 711/103 |
| 2013/0173844 A1* | 7/2013 | Chen | G06F 12/0246 711/103 |
| 2013/0322169 A1* | 12/2013 | Goss | G11C 16/22 365/185.02 |
| 2014/0003142 A1* | 1/2014 | Lee | G11C 16/10 365/185.03 |
| 2014/0059277 A1 | 2/2014 | Chung | |
| 2014/0133220 A1* | 5/2014 | Danilak | G06F 12/0246 365/158 |
| 2014/0160842 A1* | 6/2014 | Takafuji | G11C 11/5621 365/185.03 |
| 2014/0185376 A1* | 7/2014 | Sinclair | G11C 16/10 365/185.03 |
| 2014/0201423 A1* | 7/2014 | Jean | G06F 12/0246 711/103 |
| 2014/0244903 A1* | 8/2014 | Yano | G06F 12/0246 711/103 |
| 2015/0046638 A1* | 2/2015 | Choi | G11C 11/5628 711/103 |
| 2015/0149693 A1* | 5/2015 | Ng | G06F 3/0619 711/103 |
| 2015/0301763 A1* | 10/2015 | Shaharabany | G06F 3/0613 711/115 |
| 2017/0068482 A1* | 3/2017 | Ramalingam | G06F 3/0647 |
| 2017/0075812 A1* | 3/2017 | Wu | G06F 12/0893 |

OTHER PUBLICATIONS

International Search Report and Written Opinion received for International Application No. PCT/US2016/018518, dated Jun. 3, 2016, 17 pages.

International Search Report on Patentability received for International Application No. PCT/US2016/018518, dated Oct. 12, 2017, 8 pages.

* cited by examiner

SINGLE LEVEL CELL WRITE BUFFERING FOR MULTIPLE LEVEL CELL NON-VOLATILE MEMORY

FIELD

The present disclosure generally relates to the field of electronics. More particularly, some embodiments generally relate to use of non-volatile memory for write buffering.

BACKGROUND

Generally, memory used to store data in a computing system can be volatile (to store volatile information) or non-volatile (to store persistent information). Volatile data structures stored in volatile memory are generally used for temporary or intermediate information that is required to support the functionality of a program during the run-time of the program. On the other hand, persistent data structures stored in non-volatile (or persistent memory) are available beyond the run-time of a program and can be reused. Moreover, new data is typically generated as volatile data first, before a user or programmer decides to make the data persistent. For example, programmers or users may cause mapping (i.e., instantiating) of volatile structures in volatile main memory that is directly accessible by a processor. Persistent data structures, on the other hand, are instantiated on non-volatile storage devices like rotating disks attached to Input/Output (I/O or IO) buses or non-volatile memory based devices like a solid state drive.

As computing capabilities are enhanced in processors, one concern is the speed at which memory may be accessed by a processor. For example, to process data, a processor may need to first fetch data from a memory. After completion of the data processing, the results may need to be stored in the memory. Therefore, the memory access speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices as excess power consumption may increase costs (e.g., due to additional power usage, increased cooling requirements, etc.), shorten component life, limit locations at which a device may be used, etc.

Hard disk drives provide a relatively low-cost storage solution and are used in many computing devices to provide non-volatile storage. Disk drives, however, use a lot of power when compared with solid state drives since a hard disk drive needs to spin its disks at a relatively high speed and move disk heads relative to the spinning disks to read/write data. This physical movement generates heat and increases power consumption. Also, solid state drives are much faster at performing read and write operations when compared with hard drives. To this end, many computing segments are migrating towards solid state drives.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
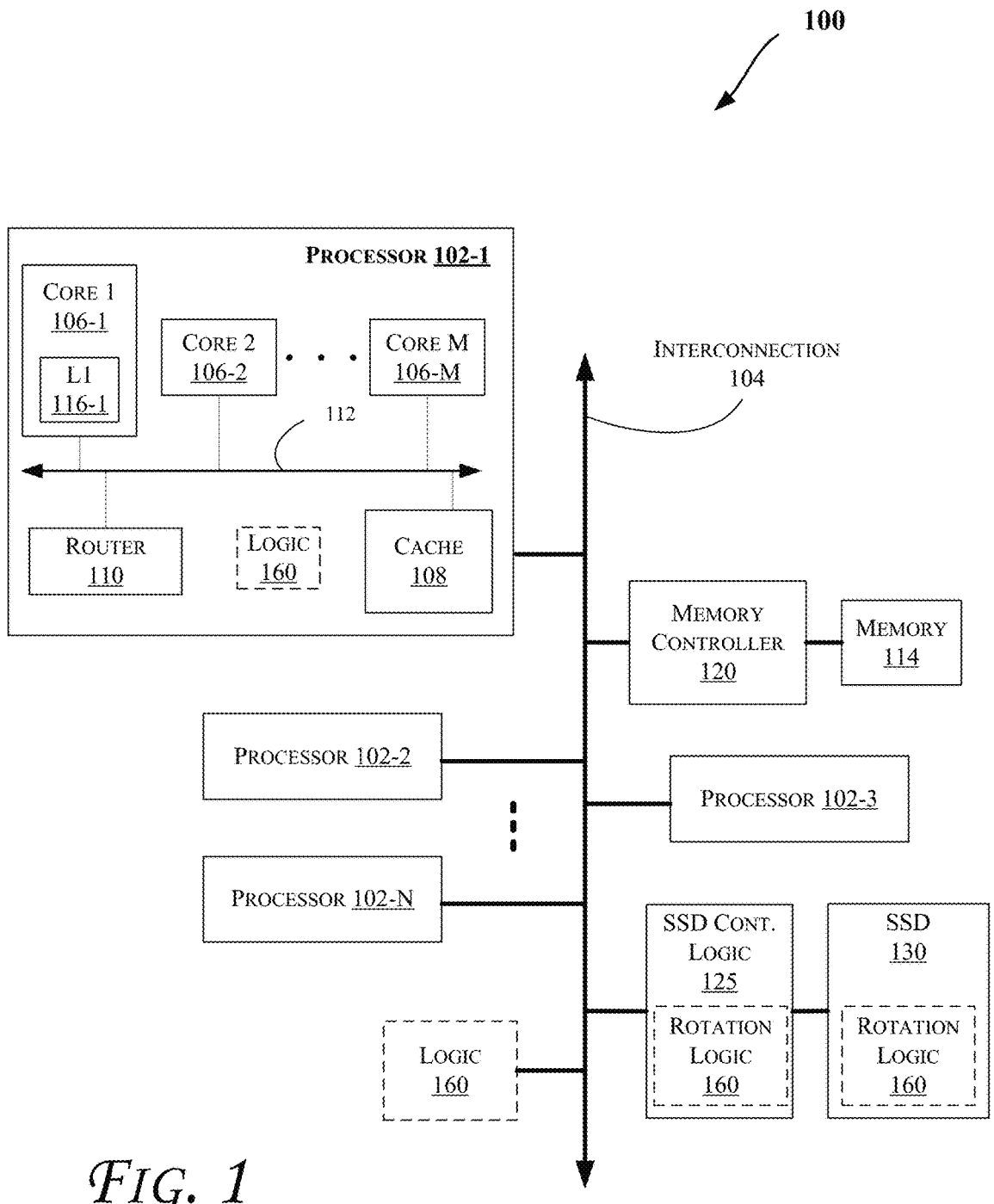
FIGS. 1 and 4-6 illustrate block diagrams of embodiments of computing systems, which may be utilized to implement various embodiments discussed herein.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As discussed above, usage of non-volatile memory (such as storage devices with NAND or NOR type memory cells) is becoming more common place. NAND media can generally be written to much faster (e.g., sometimes five times faster) when data is written in SLC (Single Level Cell) mode versus TLC (Three Level Cell) mode. In SLC mode, each cell in the NAND may store one bit of information (or two different levels, 0 and 1) while in TLC mode each cell in the NAND may store three bits of information (or eight different levels). Also, SSDs with TLC NAND (or blended SSDs) can use the NAND media in mixed mode. For example, a region of NAND in the SSD (range of erase blocks) is partitioned into SLC mode and the rest of the NAND is left in TLC mode to provide a (e.g., five-fold) boost in write performance in burst mode for some implementations. Some approaches segregate the SLC NAND region inside the SSD and size the endurance of this region to be sufficient such that all host write operations can be absorbed by this buffer (e.g., provided a user is able to stagger write operations) allowing for data stored in the SLC NAND region to waterfall to the TLC NAND region (where "waterfall" refers to data being moved from one storage location to another storage location or from one device to another device, e.g., during opportune time periods such as idle time, off-peak hours, etc.). This segregation of the SLC region requires the region to be sized for the maximum of (a) appropriate write buffering; and (b) appropriate write endurance. The sizing for appropriate write endurance aspect however results in bigger than necessary capacity reserved in the SLC NAND buffer. Since this SLC NAND buffer is unexposed capacity, there is no direct dollar per gigabyte revenue available for this essentially wasted NAND capacity.

To this end, some embodiments relate to cost optimized SLC write buffering for TLC non-volatile memory (e.g., in Solid State Drives (SSDs)). Moreover, one embodiment provides a technique to size the SLC NAND ("SLC") region for appropriate write buffering by having a revolving/dynamic SLC region without adding any new NAND capacity for SLC buffering. This in turn results in two big improvements: (a) more storage space (e.g., gigabyte(s)) of user visible capacity becomes available for comparable NAND configuration; and (b) SLC endurance requirements for the NAND component/media can be reduced (and the NAND component does not have to be qualified for SLC endurance). Also, while some embodiments are discussed with reference to TLC non-volatile memory, these embodiments are not limited to TLC non-volatile memory and may be applied to any type of multiple level cell (i.e., storing more than one bit of information per cell to provide more than 2 levels) non-volatile memory.

Furthermore, even though some embodiments are discussed with reference to defect detection in SSDs including NAND and/or NOR type of memory cells, embodiments are not limited to NAND and may be used for other types of non-volatile memory including, for example, one or more of the following (e.g., used in block storage mode): nanowire memory, Ferro-electric transistor random access memory (FeTRAM), magnetoresistive random access memory (MRAM), flash memory, Spin Torque Transfer Random Access Memory (STTRAM), Resistive Random Access Memory, byte addressable 3-Dimensional Cross Point Memory, PCM (Phase Change Memory), etc.

Moreover, processors generally access memory by load/store instructions (or their variants). Solid State Drives and Hard Disk Drives are block storage devices and use a block storage protocol. Such drives may have intolerable latency (time to access the first byte after a load request) and hence they use the aforementioned block storage protocol. Generally, they can only be accessed in 512B increments (512 Bytes is called a block) and this access is facilitated by a driver and the processor does not know how to access the stored content directly.

The techniques discussed herein may be provided in various computing systems (e.g., including a non-mobile computing device such as a desktop, workstation, server, rack system, etc. and a mobile computing device such as a smartphone, tablet, UMPC (Ultra-Mobile Personal Computer), laptop computer, Ultrabook™ computing device, smart watch, smart glasses, smart bracelet, etc.), including those discussed with reference to FIGS. 1-6. More particularly, FIG. 1 illustrates a block diagram of a computing system 100, according to an embodiment. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 120, memory controllers (such as those discussed with reference to FIGS. 4-6), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory 114 for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory 114 may be coupled to other components of system 100 through a memory controller 120. Memory 114 includes volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

System 100 may also include a Non-Volatile (NV) storage device such as an SSD 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 1, logic 125 can alternatively communicate via a storage bus/interconnect (such as the SATA (Serial Advanced Technology Attachment) bus, Peripheral Component Interconnect (PCI) (or PCI express (PCIe) interface), etc.) with one or more other components of system 100 (for example where the storage bus is coupled to interconnect 104 via some other logic like a bus bridge, chipset (such as discussed with reference to FIGS. 4-6), etc.). Additionally, logic 125 may be incorporated into memory controller logic (such as those discussed with reference to FIGS. 1 and 4-6) or provided on a same Integrated Circuit (IC) device in various embodiments (e.g., on the same IC device as the SSD 130 or in the same enclosure as the SSD 130).

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein such as those discussed with reference to other figures including 4-6, for example), including the cores 106, interconnections 104 or 112, components outside of the processor 102, SSD 130, SSD bus, SATA bus, logic 125, logic 160, etc., to sense variations in various factors affecting power/thermal behavior of the system/platform, such as temperature, operating frequency, operating voltage, power consumption, and/or inter-core communication activity, etc.

As illustrated in FIG. 1, SSD 130 may include rotation logic 160, which may be in the same enclosure as the SSD 130 and/or fully integrated on a Printed Circuit Board (PCB) of the SSD 130. Logic 160 facilitates rotation of SLC band(s)/portion(s) throughout the SSD without adverse impact to NAND characteristics as discussed herein, e.g., with reference to FIGS. 2A-6.

As mentioned above, an embodiment provides a technique to size the SLC region for appropriate write buffering by having a revolving/dynamic SLC region without adding any new NAND capacity for SLC buffering. This in turn results in two big improvements: (a) more storage space (e.g., gigabyte(s)) of user visible capacity becomes available for comparable NAND configuration, because the SLC region no longer needs to be sized for endurance); and (b) SLC endurance requirements for the NAND component/media can be reduced (and the NAND component does not have to be qualified for SLC endurance). Also, while some embodiments are discussed with reference to TLC non-volatile memory, these embodiments are not limited to TLC non-volatile memory and may be applied to any multiple level cell non-volatile memory.

For example, for a client end-user usage model, less than 20 GB/day of content may be assumed to be written and less than 1 GB written in 1 hour. An embodiment does not create segregated SLC and TLC blocks on an SSD but instead different TLC blocks are put in SLC mode at different times as necessary. These SLC mode blocks are accounted for as if they are TLC blocks with a portion (e.g., two-thirds) of the content being pads (or NOPs (NO Operations)) type data. For example, a bit per page (or other granularity of the NAND media) may indicate whether that page (or portion of NAND media) is in SLC mode or TLC mode. In some embodiment, two bits of data may be used to indicate whether a portion of NAND media (e.g., a page, bank, etc.) is in SLC mode, TLC mode, and TLC in SLC mode. For example, a first bit may indicate SLC versus TLC mode and a second bit may indicate whether the TLC is in SLC mode or a conventional TLC mode. This technique results in less than one percent of the SSD capacity to be written in burst/SLC mode. Once a "burst threshold" for write operations is exceeded/reached, data is directly written in TLC mode. The data written in SLC mode is (e.g., actively) waterfalled into TLC region during idle time between host write operations (i.e., during idle time between write operations to the SSD). This active waterfalling causes the user to see write operations at SLC bandwidth (e.g., five times faster than TLC) while increases the write amplification factor by about two-fold. With three-dimensional NAND technologies (such as 3-Dimensional Cross Point Memory), a single TLC die capacity can be around 48 GB and the smallest client SSDs may be in the 200+ GB capacity range. The three-dimensional TLC has enough endurance at this capacity to support 60 GB of NAND write operations every day for 8.8 years. Accordingly, with bigger capacities, the duration would far exceed what is needed for three years of warranty at 20 GB of host write operations per day.

As an example, to illustrate the cost benefit, 500 MB of SLC buffering is sufficient to deliver SLC burst buffering performance from analysis of client SSD traces and benchmarks.

SLC necessary for buffering: 600 MB (20% for SLC garbage collection)

40 GB/day for three years, the 600 MB SLC region would require an endurance of 121K cycles. (Actual projected SLC cycles is 20K without any effort to specifically optimize, qualify the NAND component for SLC mode.) 4 GB of SLC is needed to meet this endurance as shown in the Table 1 below.

TABLE 1

|  | OLD Technique (e.g., 200 GB configuration) | Some Embodiments (e.g., 200 GB configuration) |
| --- | --- | --- |
| TLC NAND visible to host | 200 GB | 200 GB |
| TLC NAND including over provisioning for garbage collection | 214 GB | 214 GB |
| SLC buffering | 4 GB | 0.6 GB |
| TLC + SLC buffer expressed in TLC capacity | 226 GB | 214 GB |

In SSDs, the NAND media/component is the primary cost driver. Accordingly, one embodiment allows repurposing of existing overprovisioned capacity to also include SLC write buffering, resulting in about 6% cost reduction in the NAND front (in the above example case).

Figures 2A, 2B:
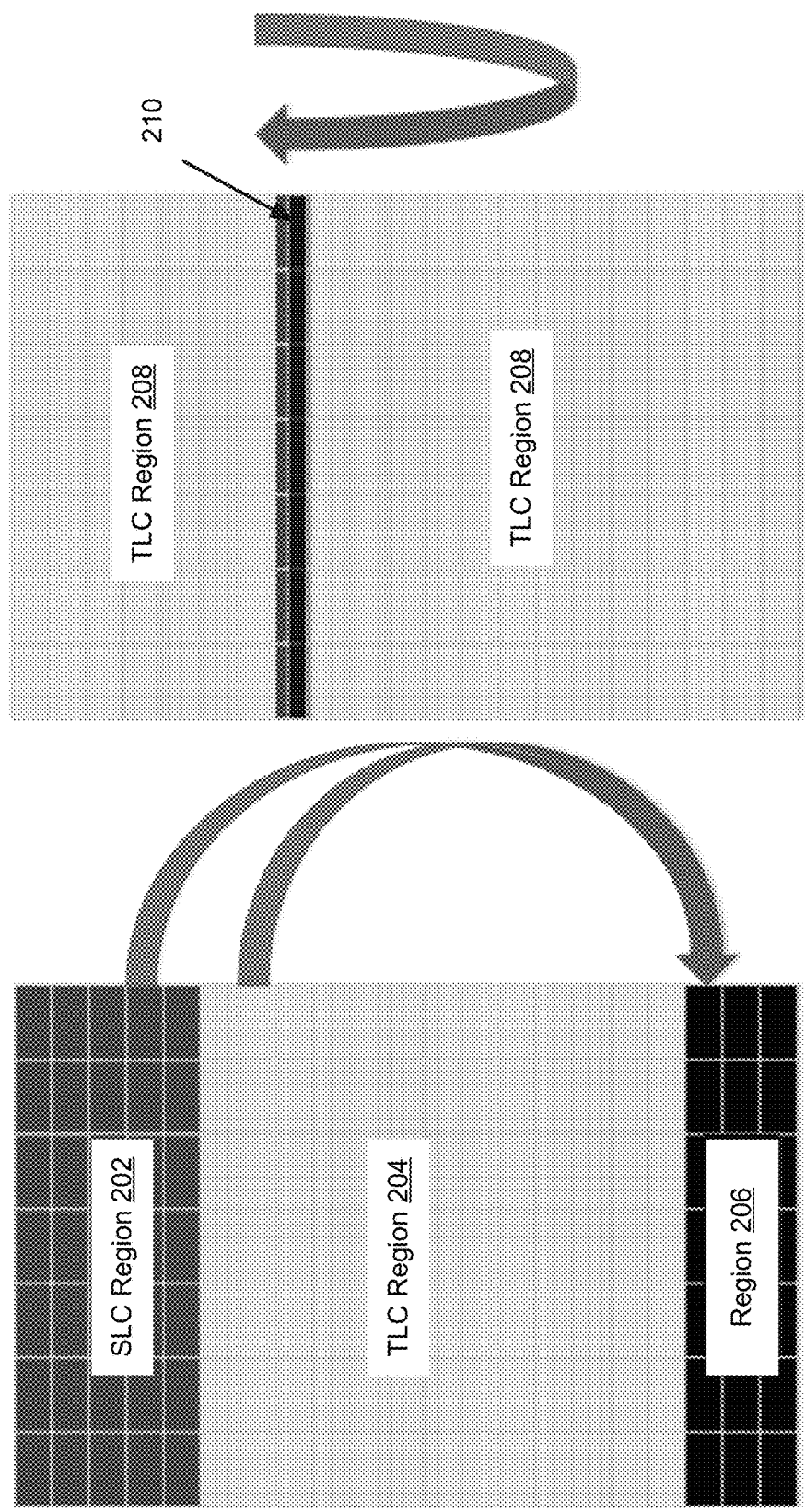
FIGS. 2A and 2B illustrate partitioned single level cell versus three level cell modes in solid state drives, according to some embodiments.

FIG. 2A shows a partitioned SLC/TLC mode in an SSD that may be used in some implementations. As shown in FIG. 2A, there are three different partitions/regions shown. Region 202 represents SLC mode blocks while region 204 represents TLC erase blocks and region 206 represents additional physical capacity mainly used as shuffle space for garbage collection. Region 206 represents a TLC region but this spare capacity is not exposed in user LBA (Logic Block Addressing).

Referring to FIG. 2A, host write operations go to the SLC region 202 directly. Once a threshold of SLC write idle time is reached, the SLC garbage collector logic (which may be implemented using logic discussed with reference to FIG. 3 such as processor(s) 384 and/or memory controller logic 386/125) picks the valid content from the SLC region 202 and moves it into the TLC region 204. Generally, garbage collection's primary purpose is to free space occupied by invalid data. In addition to its primary purpose, some SSD garbage collection mechanisms may handle moving valid data during wear leveling and Background Data Refresh (BDR), e.g., while maintaining consistent SSD performance. The aforementioned SLC write operations also creates two NAND write operations for every host write and both SLC and TLC regions need to be sized appropriately for endurance. As for the SLC/TLC region sizing, the SLC region has to be sized for both desired burst mode write buffering and useful lifetime host write operations. For example, assume there is one GB of SLC with 10K cycles and 99 GB of TLC with 1K cycles.

FIG. 2B illustrates a partitioned SLC/TLC mode in an SSD, according to an embodiment. Generally, the TLC region 208 has 10+ years of endurance available for the smallest capacities and it increases with larger capacity. Some embodiments provide a cost reduction technique to avoid allocating a large amount of SLC blocks and separately size them for endurance but instead taking advantage of the unused TLC endurance (see, e.g., FIG. 2B where region 210 is far smaller than region 206 of FIG. 2A; hence, there is far more usable space, e.g., as TLC region 208).

In one embodiment, every time a new host block is opened for writing, it is opened in SLC mode. As soon as a write idle threshold is met, the content from SLC blocks are processed/moved (e.g., garbage collected) to TLC blocks. The SLC blocks are simply accounted as if they were TLC block in terms of endurance (i.e., one SLC erase operation is counted as if it is a TLC erase operation). Moreover, TLC erase cycle is considered as the most conservative accounting possible for this operation and hence the NAND media does not need to be qualified for both modes. This allows a block to be used in either SLC mode or TLC mode without worrying about exceeding NAND cycle count.

Figure 2C:
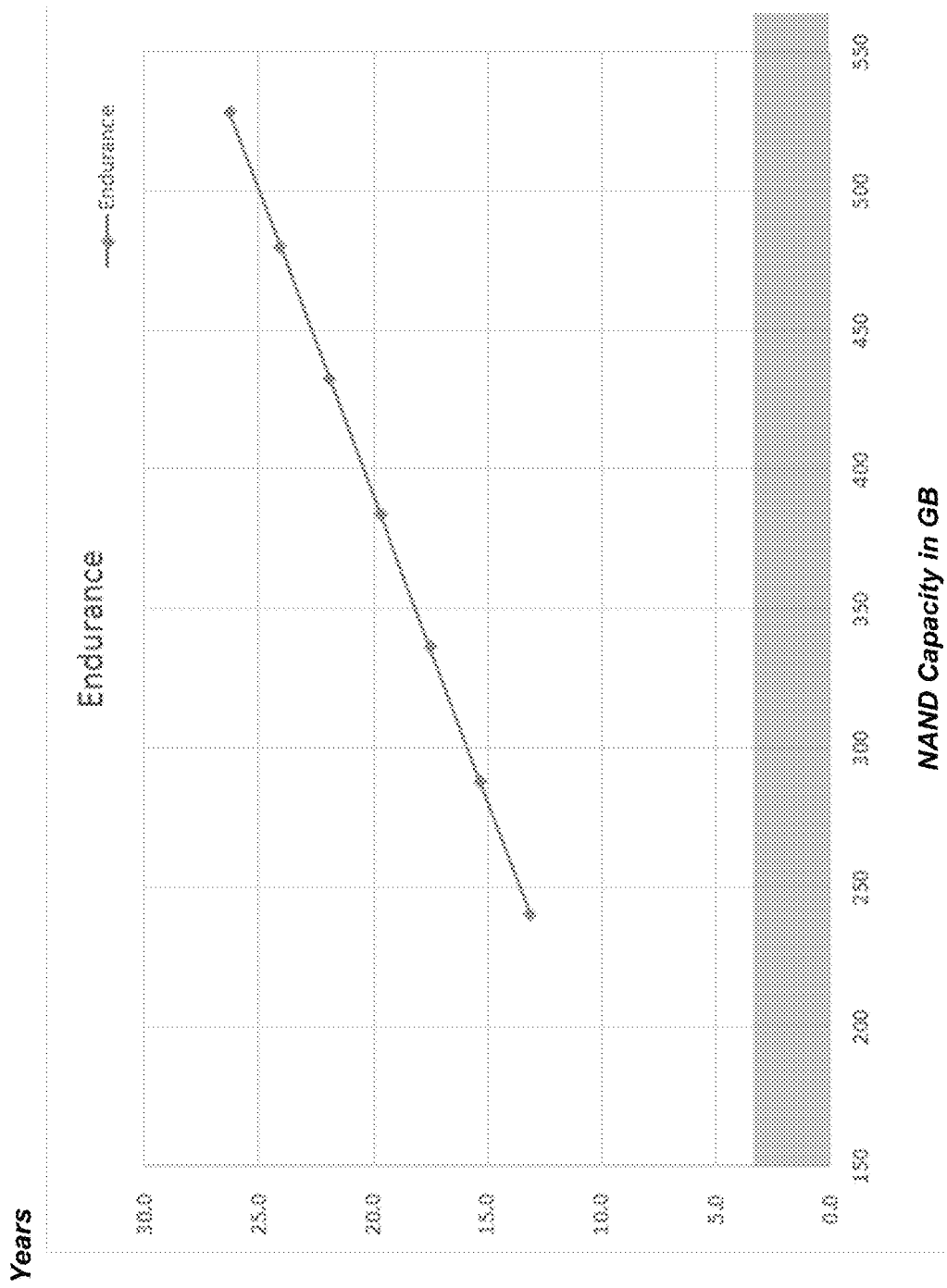
FIG. 2C illustrates a graph of years versus storage media capacity in accordance with an embodiment.

In theory, one SLC erase operation can be counted as 0.4 TLC erase operation if the block was going to be used in TLC mode. With some NAND SSDs, the general industry trend keeps increasing the minimum SSD size, typically around 128 GB in today's market and projected to be 256 GB or larger by 2017, for example, as the SSD algorithms and techniques do not scale below this capacity very well as shown in FIG. 2C. Generally, the SSD components may be rated and qualified for 3-5 years of useful life and the increased write amplification is a non-issue.

As for burst detection and bypass scheme, the above-mentioned waterfalling data from SLC to TLC with burst buffer can result in all of the SLC buffer becoming full when there is no idle time between the write operations. Such a workload is rare and to accommodate such scenarios, a bypass detection (e.g., performed by logic 160 or another logic in or coupled to an SSD, such as processor(s) 384 and/or memory controller logic 386/125) may be activated (e.g., based on some threshold value) to directly allow the host write operations to go to the TLC region. Such burst mode bypass techniques may add some error handling complexity during power loss replay and require special open band abort policies. The trade-off of simplicity versus sustained write bandwidth can be handled as a product positioning exercise. For example, an enterprise product may be more complex to sustain write bandwidth and a consumer product may be simpler to reduce costs, etc.

Furthermore, the use of rotating SLC bands significantly reduces the amount of reserved SLC in the system (such as can be seen by comparing FIGS. 2A and 2B), and as a result reduces the NAND over provisioning required in the SSD.

Figure 3:
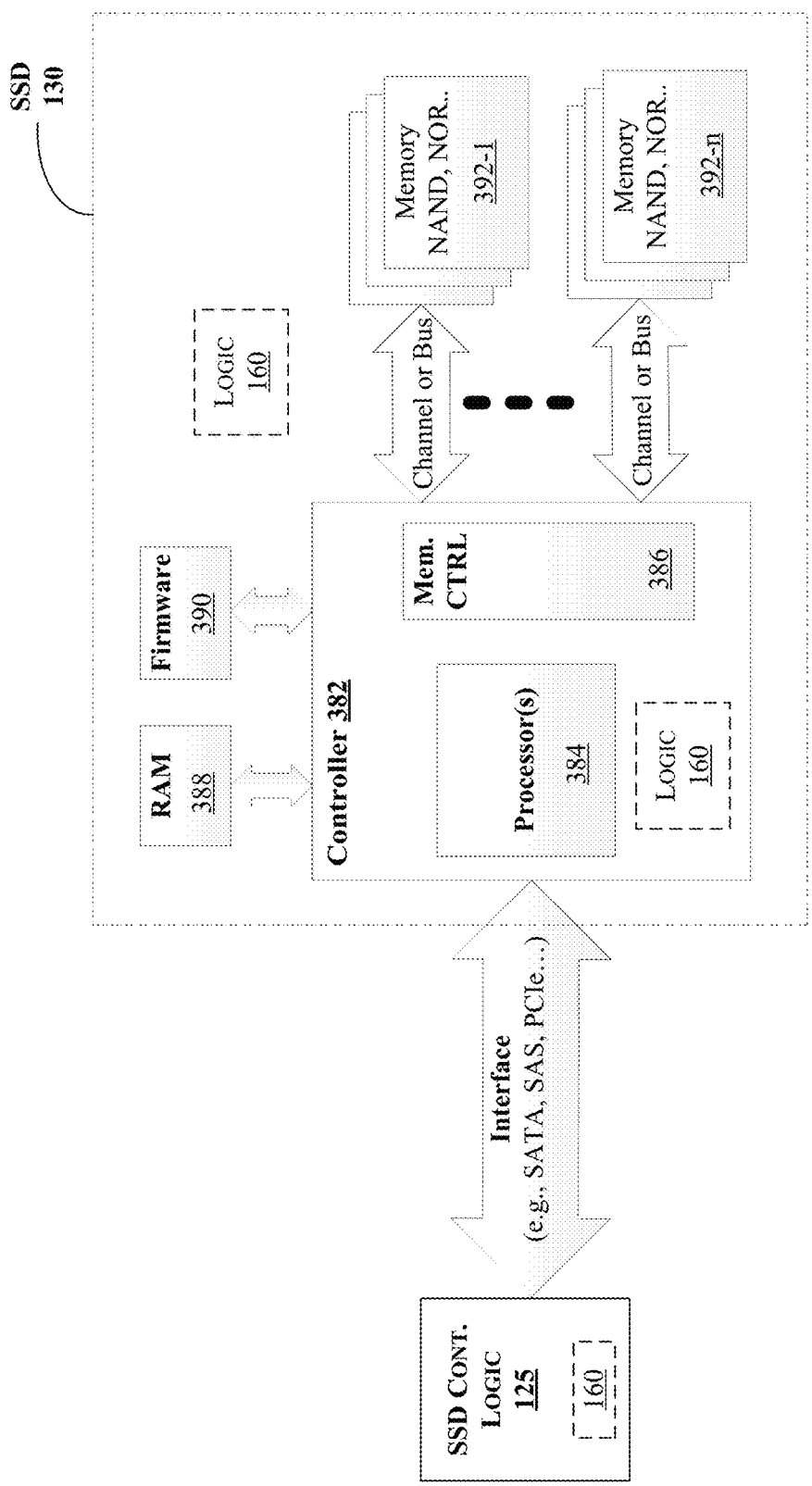
FIG. 3 illustrates a block diagram of various components of a solid state drive, according to an embodiment.

FIG. 3 illustrates a block diagram of various components of an SSD, according to an embodiment. Logic 160 may be located in various locations such as inside the SSD or SSD controller logic, e.g., such as illustrated in FIG. 3. SSD 130 includes a controller logic 382 (which in turn includes one or more processor cores or processors 384 and memory controller logic 386), Random Access Memory (RAM) 388, firmware storage 390, and one or more memory modules or dies 392-1 to 392-n (which may include NAND flash, NOR flash, or other types of non-volatile memory, such as the dies discussed with reference to FIGS. 2A-2C). Memory modules 392-1 to 392-n are coupled to the memory controller logic 386 via one or more memory channels or busses. Also, SSD 130 communicates with logic 125 via an interface (such as a SATA, SAS, PCIe (Peripheral Component Interconnect express), etc. interface). One or more of the operations discussed with reference to FIGS. 1-6 may be performed by one or more of the components of FIG. 3, e.g., processors 384 and/or controller 382 may compress/decompress (or otherwise cause compression/decompression) of data written to or read from memory modules 392-1 to 392-n. Also, one or more of the operations of FIGS. 1-6 may be programmed into the firmware 390. Further, controller 382 may include logic 160.

Figure 4:
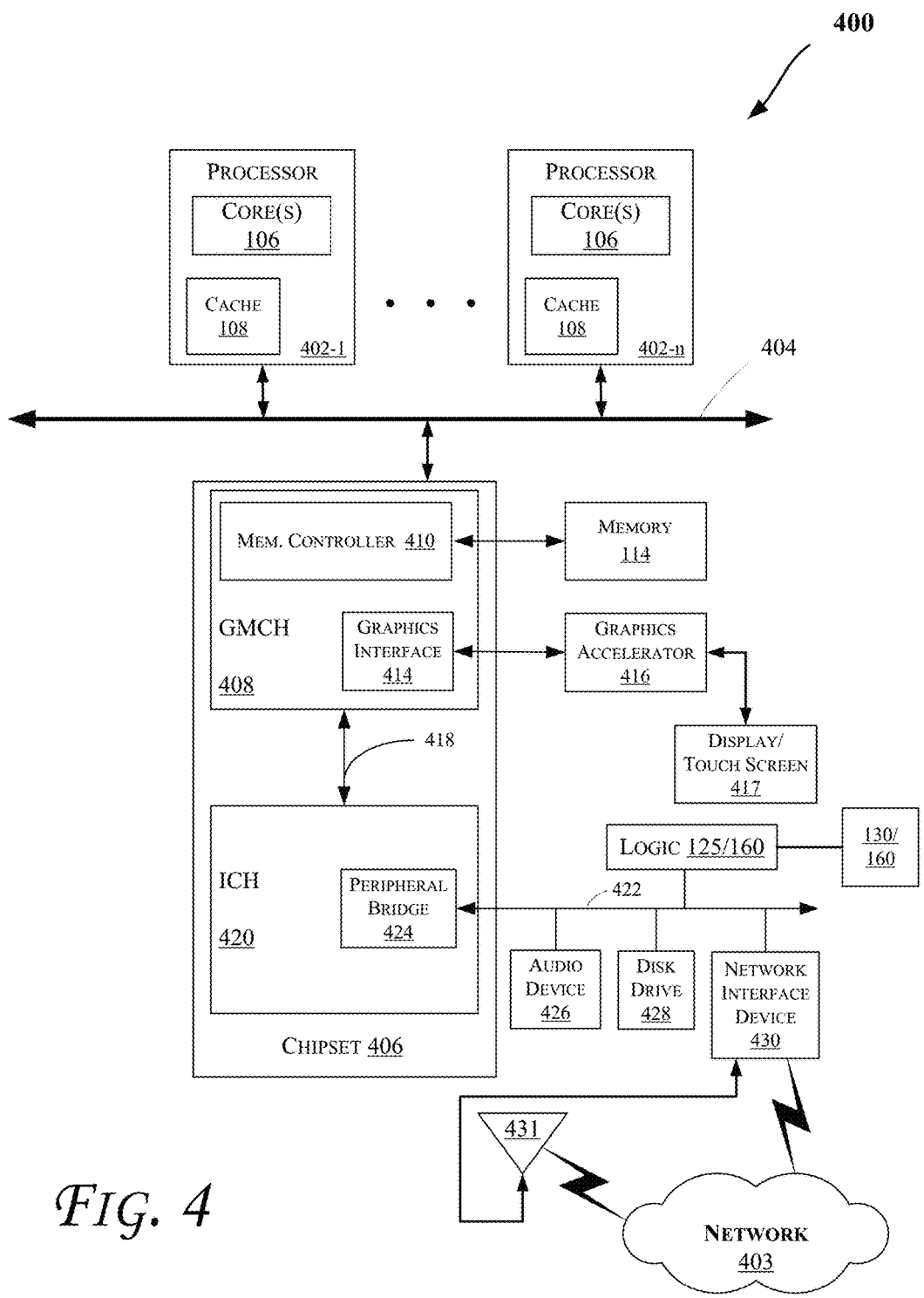

FIG. 4 illustrates a block diagram of a computing system 400 in accordance with an embodiment. The computing system 400 may include one or more central processing unit(s) (CPUs) 402 or processors that communicate via an interconnection network (or bus) 404. The processors 402 may include a general purpose processor, a network processor (that processes data communicated over a computer network 403), an application processor (such as those used in cell phones, smart phones, etc.), or other types of a processor (including a reduced instruction set computer (RISC) processor or a complex instruction set computer (CISC)). Various types of computer networks 403 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 4G, Low Power Embedded (LPE), etc.). Moreover, the processors 402 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors.

In an embodiment, one or more of the processors 402 may be the same or similar to the processors 102 of FIG. 1. For example, one or more of the processors 402 may include one or more of the cores 106 and/or cache 108. Also, the operations discussed with reference to FIGS. 1-3 may be performed by one or more components of the system 400.

A chipset 406 may also communicate with the interconnection network 404. The chipset 406 may include a graphics and memory control hub (GMCH) 408. The GMCH 408 may include a memory controller 410 (which may be the same or similar to the memory controller 120 of FIG. 1 in an embodiment) that communicates with the memory 114. The memory 114 may store data, including sequences of instructions that are executed by the CPU 402, or any other device included in the computing system 400. Also, system 400 includes logic 125, SSD 130, and/or logic 160 (which may be coupled to system 400 via bus 422 as illustrated, via other interconnects such as 404, where logic 125 is incorporated into chipset 406, etc. in various embodiments). In one embodiment, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk drive, flash, etc., including any NVM discussed herein. Additional devices may communicate via the interconnection network 404, such as multiple CPUs and/or multiple system memories.

The GMCH 408 may also include a graphics interface 414 that communicates with a graphics accelerator 416. In one embodiment, the graphics interface 414 may communicate with the graphics accelerator 416 via an accelerated graphics port (AGP) or Peripheral Component Interconnect (PCI) (or PCI express (PCIe) interface). In an embodiment, a display 417 (such as a flat panel display, touch screen, etc.) may communicate with the graphics interface 414 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 417.

A hub interface 418 may allow the GMCH 408 and an input/output control hub (ICH) 420 to communicate. The ICH 420 may provide an interface to I/O devices that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 420, e.g., through multiple bridges or controllers. Moreover, other peripherals in communication with the ICH 420 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403, e.g., via a wired or wireless interface). As shown, the network interface device 430 may be coupled to an antenna 431 to wirelessly (e.g., via an Institute of Electrical and Electronics Engineers (IEEE) 802.11 interface (including IEEE 802.11a/b/g/n/ac, etc.), cellular interface, 3G, 4G, LPE, etc.) communicate with the network 403. Other devices may communicate via the bus 422. Also, various components (such as the network interface device 430) may communicate with the GMCH 408 in some embodiments. In addition, the processor 402 and the GMCH 408 may be combined to form a single chip. Furthermore, the graphics accelerator 416 may be included within the GMCH 408 in other embodiments.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 5:
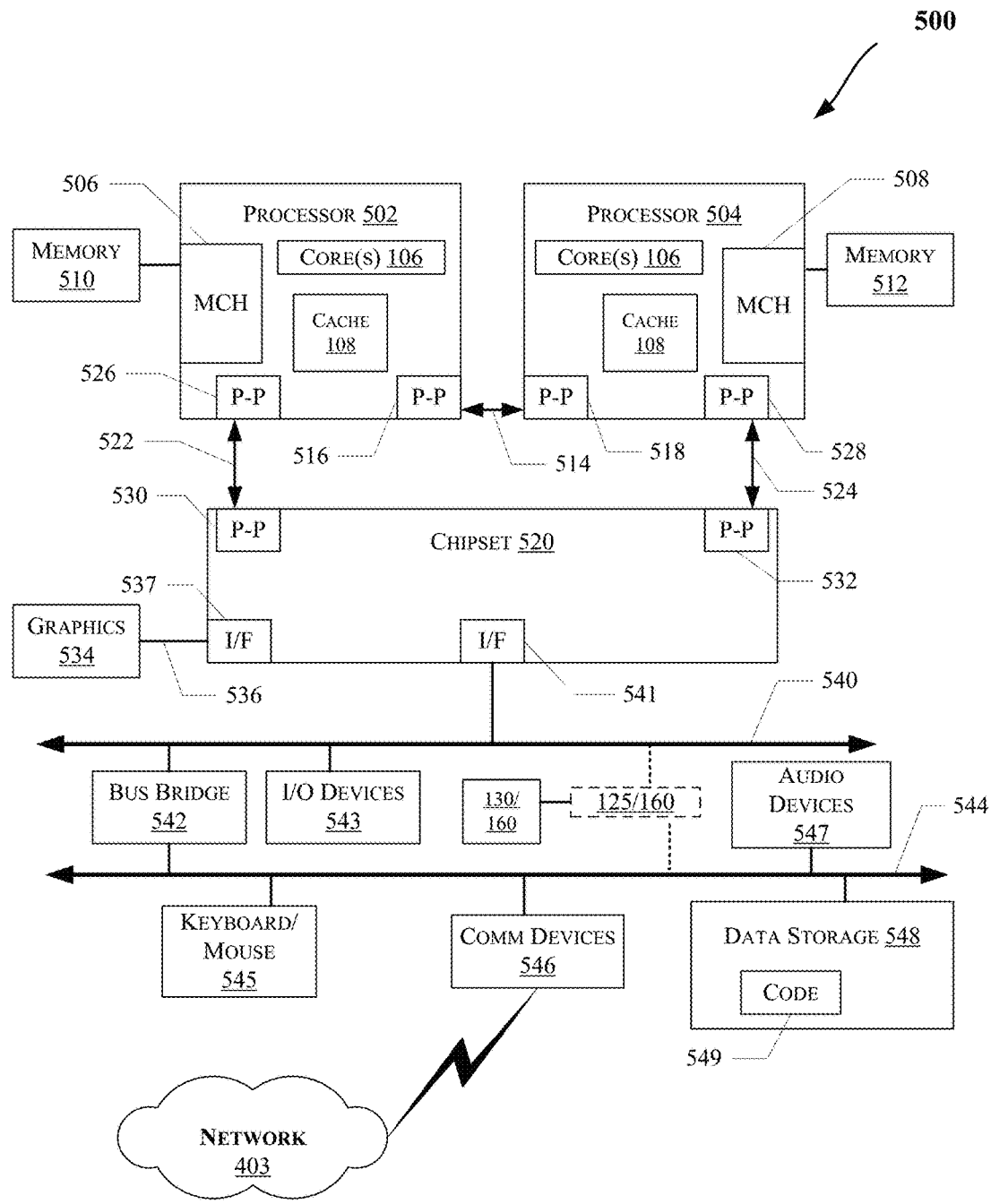

FIG. 5 illustrates a computing system 500 that is arranged in a point-to-point (PtP) configuration, according to an embodiment. In particular, FIG. 5 shows a system where processors, memory, and input/output devices are interconnected by a number of point-to-point interfaces. The operations discussed with reference to FIGS. 1-4 may be performed by one or more components of the system 500.

As illustrated in FIG. 5, the system 500 may include several processors, of which only two, processors 502 and 504 are shown for clarity. The processors 502 and 504 may each include a local memory controller hub (MCH) 506 and 508 to enable communication with memories 510 and 512. The memories 510 and/or 512 may store various data such as those discussed with reference to the memory 114 of FIGS. 1 and/or 4. Also, MCH 506 and 508 may include the memory controller 120 in some embodiments. Furthermore, system 500 includes logic 125, SSD 130, and/or logic 160 (which may be coupled to system 500 via bus 540/544 such as illustrated, via other point-to-point connections to the processor(s) 502/504 or chipset 520, where logic 125 is incorporated into chipset 520, etc. in various embodiments).

In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Also, the processors 502 and 504 may each exchange data with a chipset 520 via individual PtP interfaces 522 and 524 using point-to-point interface circuits 526, 528, 530, and 532. The chipset 520 may further exchange data with a high-performance graphics circuit 534 via a high-performance graphics interface 536, e.g., using a PtP interface circuit 537. As discussed with reference to FIG. 4, the graphics interface 536 may be coupled to a display device (e.g., display 417) in some embodiments.

As shown in FIG. 5, one or more of the cores 106 and/or cache 108 of FIG. 1 may be located within the processors 502 and 504. Other embodiments, however, may exist in other circuits, logic units, or devices within the system 500 of FIG. 5. Furthermore, other embodiments may be distributed throughout several circuits, logic units, or devices illustrated in FIG. 5.

The chipset 520 may communicate with a bus 540 using a PtP interface circuit 541. The bus 540 may have one or more devices that communicate with it, such as a bus bridge 542 and I/O devices 543. Via a bus 544, the bus bridge 542 may communicate with other devices such as a keyboard/mouse 545, communication devices 546 (such as modems, network interface devices, or other communication devices that may communicate with the computer network 403, as discussed with reference to network interface device 430 for example, including via antenna 431), audio I/O device, and/or a data storage device 548. The data storage device 548 may store code 549 that may be executed by the processors 502 and/or 504.

Figure 6:
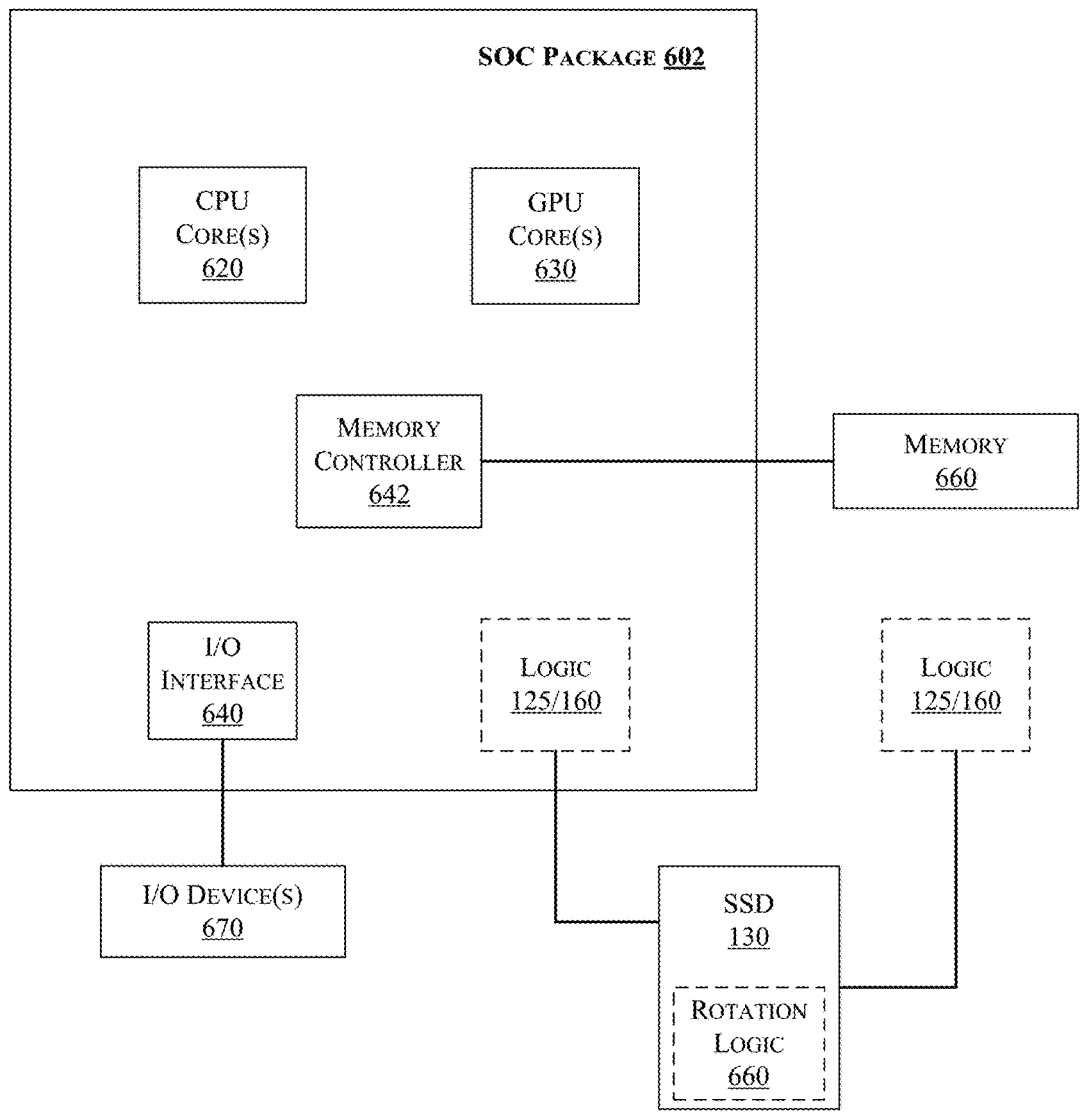

In some embodiments, one or more of the components discussed herein can be embodied as a System On Chip (SOC) device. FIG. 6 illustrates a block diagram of an SOC package in accordance with an embodiment. As illustrated in FIG. 6, SOC 602 includes one or more Central Processing Unit (CPU) cores 620, one or more Graphics Processor Unit (GPU) cores 630, an Input/Output (I/O) interface 640, and a memory controller 642. Various components of the SOC package 602 may be coupled to an interconnect or bus such as discussed herein with reference to the other figures. Also, the SOC package 602 may include more or less components, such as those discussed herein with reference to the other figures. Further, each component of the SOC package 620 may include one or more other components, e.g., as discussed with reference to the other figures herein. In one embodiment, SOC package 602 (and its components) is provided on one or more Integrated Circuit (IC) die, e.g., which are packaged onto a single semiconductor device.

As illustrated in FIG. 6, SOC package 602 is coupled to a memory 660 (which may be similar to or the same as memory discussed herein with reference to the other figures) via the memory controller 642. In an embodiment, the memory 660 (or a portion of it) can be integrated on the SOC package 602.

The I/O interface 640 may be coupled to one or more I/O devices 670, e.g., via an interconnect and/or bus such as discussed herein with reference to other figures. I/O device(s) 670 may include one or more of a keyboard, a mouse, a touchpad, a display, an image/video capture device (such as a camera or camcorder/video recorder), a touch screen, a speaker, or the like. Furthermore, SOC package 602 may include/integrate the logic 125 in an embodiment. Alternatively, the logic 125 may be provided outside of the SOC package 602 (i.e., as a discrete logic).

The following examples pertain to further embodiments. Example 1 includes 1 includes an apparatus comprising: non-volatile memory to include a first region in a Single Level Cell (SLC) mode and a second region in a multiple level cell mode; and logic to move a portion of the second region from the multiple level cell mode to the SLC mode without adding any new capacity to the non-volatile memory and without reducing any existing capacity from the non-volatile memory. Example 2 includes the apparatus of example 1, wherein data written to the portion of the second region is to be moved to the first region during an idle time between write operations directed at the non-volatile memory. Example 3 includes the apparatus of example 1, comprising logic to move one or more portions of the second region from the multiple level cell mode to the SLC mode to create the first region. Example 4 includes the apparatus of example 1, wherein burst write operations are to be directed at the first region. Example 5 includes the apparatus of example 1, wherein burst write operations are to be directed at the second region in response to a threshold number of burst write operations directed at the first region. Example 6 includes the apparatus of example 1, wherein the multiple level cell mode is a Three Level Cell (TLC) mode. Example 7 includes the apparatus of example 1, wherein the non-volatile memory, the logic, and a Solid State Drive (SSD) are on a same integrated circuit device. Example 8 includes the apparatus of example 1, wherein the non-volatile memory is to comprise one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory. Example 9 includes the apparatus of example 1, wherein an SSD is to comprise the non-volatile memory and the logic.

Example 10 includes a method comprising: partitioning non-volatile memory to include a first region in a Single Level Cell (SLC) mode and a second region in a multiple level cell mode; and moving a portion of the second region from the multiple level cell mode to the SLC mode without adding any new capacity to the non-volatile memory and without reducing any existing capacity from the non-volatile memory. Example 11 includes the method of example 10, further comprising moving data written to the portion of the second region to the first region during an idle time between write operations directed at the non-volatile memory. Example 12 includes the method of example 10, further comprising moving one or more portions of the second region from the multiple level cell mode to the SLC mode to create the first region. Example 13 includes the method of example 10, further comprising directing burst write operations at the first region. Example 14 includes the method of example 10, further comprising directing burst write operations at the second region in response to a threshold number of burst write operations directed at the first region. Example 15 includes the method of example 10, wherein the multiple level cell mode is a Three Level Cell (TLC) mode. Example 16 includes the method of example 10, wherein the non-volatile memory comprises one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory.

Example 17 includes a system comprising: non-volatile memory; and at least one processor core to access the non-volatile memory; the non-volatile memory to include a first region in a Single Level Cell (SLC) mode and a second region in a multiple level cell mode; and logic to move a portion of the second region from the multiple level cell mode to the SLC mode without adding any new capacity to the non-volatile memory and without reducing any existing capacity from the non-volatile memory. Example 18 includes the system of example 17, wherein data written to the portion of the second region is to be moved to the first region during an idle time between write operations directed at the non-volatile memory. Example 19 includes the system of example 17, comprising logic to move one or more portions of the second region from the multiple level cell mode to the SLC mode to create the first region. Example 20 includes the system of example 17, wherein burst write operations are to be directed at the first region. Example 21 includes the system of example 17, wherein burst write operations are to be directed at the second region in response to a threshold number of burst write operations directed at the first region. Example 22 includes the system of example 17, wherein the multiple level cell mode is a Three Level Cell (TLC) mode. Example 23 includes the system of example 17, wherein the non-volatile memory, the logic, and a Solid State Drive (SSD) are on a same integrated circuit device. Example 24 includes the system of example 17, wherein the non-volatile memory is to comprise one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory. Example 25 includes the system of example 17, wherein an SSD is to comprise the non-volatile memory and the logic.

Example 26 includes a computer-readable medium comprising one or more instructions that when executed on a processor configure the processor to perform one or more operations to: partition non-volatile memory to include a first region in a Single Level Cell (SLC) mode and a second region in a multiple level cell mode; and move a portion of the second region from the multiple level cell mode to the SLC mode without adding any new capacity to the non-volatile memory and without reducing any existing capacity from the non-volatile memory. Example 27 includes the computer-readable medium of example 26, further comprising one or more instructions that when executed on the processor configure the processor to perform one or more operations to cause moving of data written to the portion of the second region to the first region during an idle time between write operations directed at the non-volatile memory. Example 28 includes the computer-readable medium of example 26, further comprising one or more instructions that when executed on the processor configure the processor to perform one or more operations to cause moving of one or more portions of the second region from the multiple level cell mode to the SLC mode to create the first region. Example 29 includes the computer-readable medium of example 26, further comprising one or more instructions that when executed on the processor configure the processor to perform one or more operations to cause directing of burst write operations at the first region. Example 30 includes the computer-readable medium of example 26, further comprising one or more instructions that when executed on the processor configure the processor to perform one or more operations to cause directing of burst write operations at the second region in response to a threshold number of burst write operations directed at the first region. Example 31 includes the computer-readable medium of example 26, wherein the multiple level cell mode is a Three Level Cell (TLC) mode. Example 32 includes the computer-readable medium of example 26, wherein the non-volatile memory comprises one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory.

Example 33 includes an apparatus comprising means to perform a method as set forth in any preceding example.

Example 34 comprises machine-readable storage including machine-readable instructions, when executed, to implement a method or realize an apparatus as set forth in any preceding example.

In various embodiments, the operations discussed herein, e.g., with reference to FIGS. 1-6, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-6.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
   non-volatile memory to include a first region in a Single Level Cell (SLC) mode, a second region in a multiple level cell (MLC) mode, and a third region in the MLC mode, wherein the third region is to be unexposed as user addressable space; and
   logic to move a portion of the second region from the multiple level cell mode to the SLC mode, wherein the portion of the second region is capable to enter into the SLC mode based on status of at least one bit, wherein each time one or more new blocks are opened for writing, they are to be opened in SLC mode and once a write idle threshold is met, content from one or more SLC blocks are to be garbage collected to one or more MLC blocks, wherein burst write operations are to be directed at the second region in response to a threshold number of burst write operations directed at the first region.

2. The apparatus of claim 1, wherein data written to the portion of the second region is to be moved to the first region during an idle time between write operations directed at the non-volatile memory.

3. The apparatus of claim 1, comprising logic to move one or more portions of the second region from the multiple level cell mode to the SLC mode to create the first region.

4. The apparatus of claim 1, wherein burst write operations are to be directed at the first region.

5. The apparatus of claim 1, wherein the multiple level cell mode is a Three Level Cell (TLC) mode.

6. The apparatus of claim 1, wherein the non-volatile memory, the logic, and a Solid State Drive (SSD) are on a same integrated circuit device.

7. The apparatus of claim 1, wherein the non-volatile memory is to comprise one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory.

8. The apparatus of claim 1, wherein an SSD is to comprise the non-volatile memory and the logic.

9. The apparatus of claim 1, wherein the third region is to store data for garbage collection.

10. The apparatus of claim 1, wherein data written to non-volatile memory is to be written to the first region in the SLC mode, wherein the written data to the first region in the SLC mode is to be moved to the second region during an idle time between write operations directed at the non-volatile memory.

11. The apparatus of claim 1, wherein the logic is to move the portion of the second region from the multiple level cell mode to the SLC mode without adding any new capacity to the non-volatile memory and without reducing any existing capacity from the non-volatile memory.

12. A method comprising:
   partitioning non-volatile memory to include a first region in a Single Level Cell (SLC) mode, a second region in a multiple level cell (MLC) mode, and a third region in the MLC mode, wherein the third region is unexposed as user addressable space; and
   moving a portion of the second region from the multiple level cell mode to the SLC mode, wherein the portion of the second region is capable to enter into the SLC mode based on status of at least one bit, wherein each time one or more new blocks are opened for writing, they are opened in SLC mode and once a write idle threshold is met, content from one or more SLC blocks are garbage collected to one or more MLC blocks, wherein burst write operations are directed at the second region in response to a threshold number of burst write operations directed at the first region.

13. The method of claim 12, further comprising moving data written to the portion of the second region to the first region during an idle time between write operations directed at the non-volatile memory.

14. The method of claim 12, further comprising moving one or more portions of the second region from the multiple level cell mode to the SLC mode to create the first region.

15. The method of claim 12, further comprising directing burst write operations at the first region.

16. The method of claim 12, wherein the multiple level cell mode is a Three Level Cell (TLC) mode.

17. The method of claim 12, wherein the non-volatile memory comprises one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory.

18. A system comprising:
   non-volatile memory; and
   at least one processor core to access the non-volatile memory;
   the non-volatile memory to include a first region in a Single Level Cell (SLC) mode and a second region in a multiple level cell (MLC) mode, and a third region in the MLC mode, wherein the third region is to be unexposed as user addressable space; and
   logic to move a portion of the second region from the multiple level cell mode to the SLC mode, wherein the portion of the second region is capable to enter into the SLC mode based on status of at least one bit, wherein each time one or more new blocks are opened for writing, they are to be opened in SLC mode and once a write idle threshold is met, content from one or more SLC blocks are to be garbage collected to one or more MLC block, wherein burst write operations are to be directed at the second region in response to a threshold number of burst write operations directed at the first region.

19. The system of claim 18, wherein data written to the portion of the second region is to be moved to the first region during an idle time between write operations directed at the non-volatile memory.

20. The system of claim 18, comprising logic to move one or more portions of the second region from the multiple level cell mode to the SLC mode to create the first region.

21. The system of claim 18, wherein burst write operations are to be directed at the first region.

22. The system of claim 18, wherein the multiple level cell mode is a Three Level Cell (TLC) mode.

23. The system of claim 18, wherein the non-volatile memory, the logic, and a Solid State Drive (SSD) are on a same integrated circuit device.

24. The system of claim 18, wherein the non-volatile memory is to comprise one of: nanowire memory, Ferro-electric transistor random access memory (FeTRAM), magnetoresistive random access memory (MRAM), flash memory, Spin Torque Transfer Random Access Memory (STTRAM), Resistive Random Access Memory, Phase Change Memory (PCM), and byte addressable 3-Dimensional Cross Point Memory.

25. The system of claim 18, wherein an SSD is to comprise the non-volatile memory and the logic.

* * * * *